(12) United States Patent
Yuge (10) Patent No.: US 7,825,035 B2
(45) Date of Patent: Nov. 2, 2010

(54) SEMICONDUCTOR MANUFACTURING METHOD

(75) Inventor: Shozo Yuge, Fukuoka-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1076 days.

(21) Appl. No.: 11/525,215

(22) Filed: Sep. 22, 2006

(65) Prior Publication Data
US 2007/0066075 A1  Mar. 22, 2007

(30) Foreign Application Priority Data
Sep. 22, 2005  (JP)  ............................ 2005-276735

(51) Int. Cl.
*H01L 21/00*  (2006.01)
(52) U.S. Cl. .................. 438/758; 438/770; 438/773
(58) Field of Classification Search .................. 438/758, 438/770, 773
See application file for complete search history.

(56) References Cited

U.S. PATENT DOCUMENTS

| | | | |
|---|---|---|---|
| 4,422,898 A * | 12/1983 | MacChesney et al. | ......... 216/12 |
| 6,257,757 B1 | 7/2001 | Nakamura | |
| 6,562,143 B1 | 5/2003 | Makishi | |
| 6,610,612 B2 * | 8/2003 | Dagenais et al. | ............ 438/767 |
| 6,660,628 B1 | 12/2003 | Pan et al. | |
| 7,368,368 B2 * | 5/2008 | Emerson | ..................... 438/505 |
| 2002/0155712 A1 * | 10/2002 | Urashima et al. | ........... 438/689 |
| 2004/0248385 A1 * | 12/2004 | Tanaka et al. | ............... 438/476 |

FOREIGN PATENT DOCUMENTS

JP  2001-107242  4/2001

* cited by examiner

*Primary Examiner*—Robert M Kunemund
*Assistant Examiner*—Matthew J Song
(74) *Attorney, Agent, or Firm*—Banner & Witcoff, Ltd.

(57) ABSTRACT

A semiconductor manufacturing method includes purging a growth chamber including a reaction product, a treatment chamber, and a glove box hermetically surrounding the growth chamber, with an inert gas atmosphere. The method also includes transferring the reaction product from the growth chamber to the treatment chamber, followed by moistening the reaction product in the treatment chamber, and extracting the moistened reaction product into the atmosphere.

8 Claims, 7 Drawing Sheets

SEMICONDUCTOR MANUFACTURING METHOD

CROSS-REFERENCE TO RELATED APPLICATIONS

This application is based upon and claims the benefit of priority under 35 USC §119 from prior Japanese Patent Application No. 2005-276735, filed on Sep. 22, 2005; the entire contents of which are incorporated herein by reference.

BACKGROUND

Compound semiconductors containing phosphorus (P) as a group V element, such as InGaAlP, InGaAsP, GaP, GaAsP, and GaNP, have high P vapor pressure. Thus, they are subjected to epitaxial crystal growth under the P vapor pressure that is maintained several hundred times higher than the vapor pressure of group III elements such as In, Ga, and Al. Therefore, in vapor deposition techniques including MOCVD, part of thermally decomposed material gas is used for crystal growth of compound semiconductors, whereas much of the rest not used for crystal growth is cooled and deposited as reaction product in the growth chamber.

With the repetition of epitaxial crystal growth, the amount of deposited reaction product gradually increases, and the impurity concentration in the growth chamber is deteriorated, thereby preventing epitaxial crystal growth. For removing reaction product and recovering a suitable condition for epitaxial crystal growth, a maintenance operation is conducted. Reaction product contains a large amount of P and P compounds. If they are exposed to the atmosphere, P reacting with oxygen may catch fire and endanger the maintenance operation for removing reaction product.

SUMMARY

According to an aspect of the invention, there is provided a semiconductor manufacturing method comprising: purging a growth chamber including a reaction product, a treatment chamber, and a glove box hermetically surrounding the growth chamber, with an inert gas atmosphere; transferring the reaction product from the growth chamber to the treatment chamber, followed by moistening the reaction product in the treatment chamber; and extracting the moistened reaction product into the atmosphere.

DETAILED DESCRIPTION

Embodiments of the invention will be described with reference to the drawings. In the figures referred to in the following, like components are marked with like reference numerals.

Figure 1:
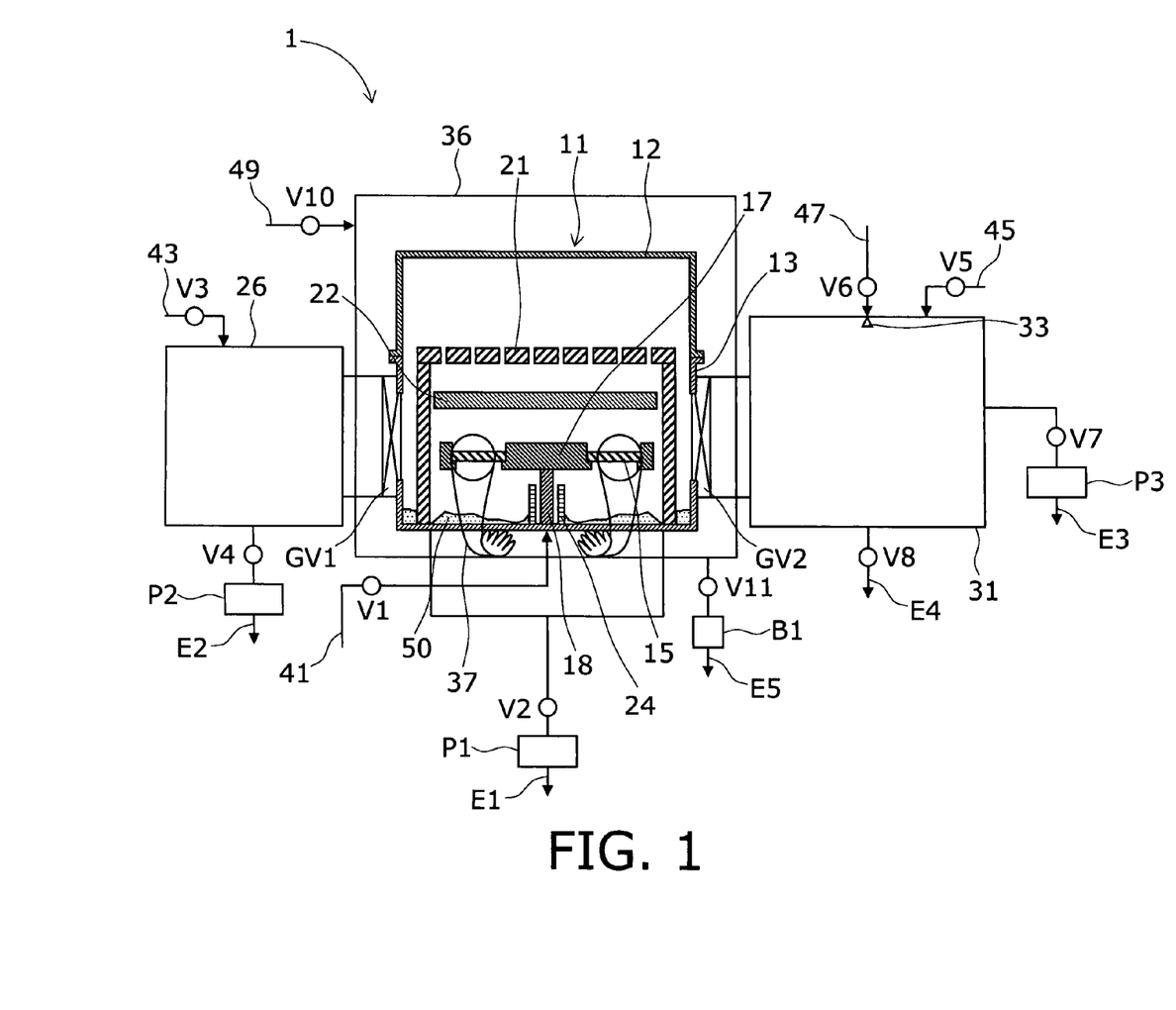
FIG. 1 is a schematic front view of a semiconductor manufacturing apparatus according to a first embodiment.

FIG. 1 is a schematic front view of the semiconductor manufacturing apparatus, showing a cutaway cross section of the growth chamber after epitaxial crystal growth (hereinafter referred to as crystal growth).

As shown in FIG. 1, the semiconductor manufacturing apparatus or MOCVD apparatus 1 has a growth chamber 11 for performing crystal growth on a substrate 15 made of semiconductor or the like, a load lock chamber 26 for loading and unloading the substrate 15 into and out of the growth chamber 11, a treatment chamber 31 for performing ignition preventing treatment on reaction product 50, a gate valve GV2 which is a connecting portion openably and closably interconnecting between the growth chamber 11 and the treatment chamber 31, and a glove box 36 surrounding the growth chamber 11 and capable of hermetically sealing the inside thereof. The growth chamber 11 is made of, for example, stainless steel and can be separated into an upper chamber 12 and a lower chamber 13. The lower chamber 13 is connected to the load lock chamber 26 via a gate valve GV1 and to the treatment chamber 31 via the gate valve GV2. The upper chamber 12 is connected on top of the lower chamber 13, and the inside of the upper chamber 12 can be hermetically sealed after being connected. The upper chamber 12 can be separated from the lower chamber 13 to open the glove 37 side of the glove box 36.

During the crystal growth process, reaction product is adhered to and accumulated in the inner wall of the growth chamber 11, for example, to the bottom and other portions of the lower chamber 13. In this embodiment, the reaction product may be removed from the growth chamber 11 safely and easily by providing the glove box 36 and the treatment chamber 31.

Figure 2:
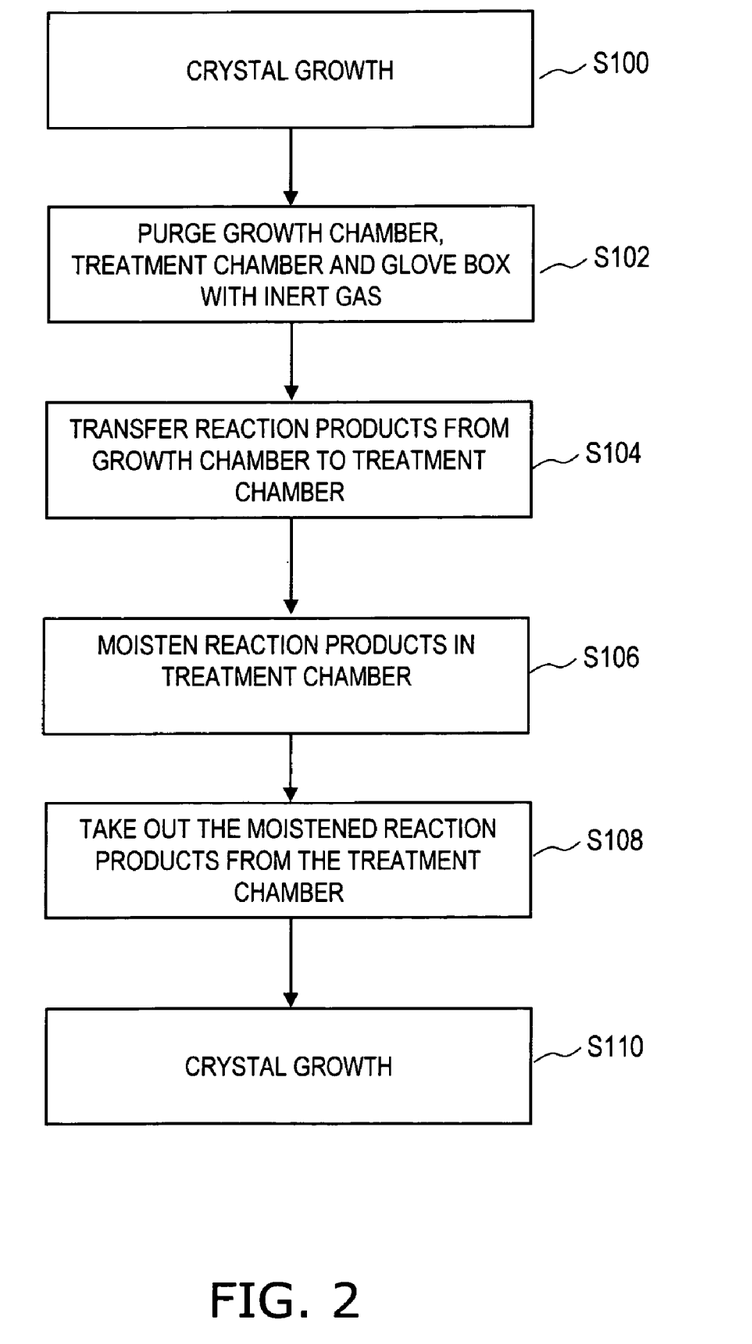
FIG. 2 is a flow chart of a semiconductor manufacturing method according to the first embodiment.

FIG. 2 is a flow chart showing the semiconductor manufacturing method according to this embodiment.

After the crystal growth of semiconductor (step S100), first, the growth chamber 11, the treatment chamber 31 and the glove box 36 are purged with an inert gas (step S102). More specifically, an inert gas such as nitrogen is introduced into the growth chamber 11 and the treatment chamber 31 while keeping the gate valve GV2 closed, and the inert gas is also introduced into the glove box 36.

Next, the reaction product accumulated in the growth chamber 11 is transferred to the treatment chamber 31 (step S104). Namely, the gate valve GV2 is opened, and the upper chamber 12 is separated from the lower chamber 13. Then, the reaction product accumulated in the growth chamber 11 is removed and transferred to the treatment chamber 31 by using the pair of gloves 37 and/or any appropriate tools.

Then, the reaction product transferred to the treatment chamber is moistened (step S106). Namely, the gate valve GV2 is closed, water shower and/or mist are poured from the overlying spray nozzle 33 onto the reaction product in the treatment chamber 31. Moistening the reaction product can prevent phosphorous which is contained therein from reacting with oxygen in the air and catching fire.

After that, the moistened reaction product is taken out from the treatment chamber 31 (step S108). As the reaction product may be sufficiently moistened, it is safely taken out of the treatment chamber 31, and decontamination process can be safely performed. Afterward, a crystal growth of semiconductors can be performed again (step S110).

As explained above, according to the embodiment, the treatment chamber 31 and the glove box 36 are provided with the growth chamber 11, and the reaction product is transferred from the growth chamber 11 to the treatment chamber 31 in the inert atmosphere. Then, the reaction product is safely and sufficiently moistened in the treatment chamber 31. As a result, the reaction product is safely and quickly removed and disposed of, and the production yield of semiconductors can be improved.

As will be explained with reference to FIG. 7 afterward, the growth chamber 11 and the treatment chamber 31 are not necessarily connected by the gate valve GV2. The invention may include system configurations where the reaction product accumulated in the growth chamber 11 can be removed and transferred to the treatment chamber 31 in the inert atmosphere in the glove box 36.

Figure 3:
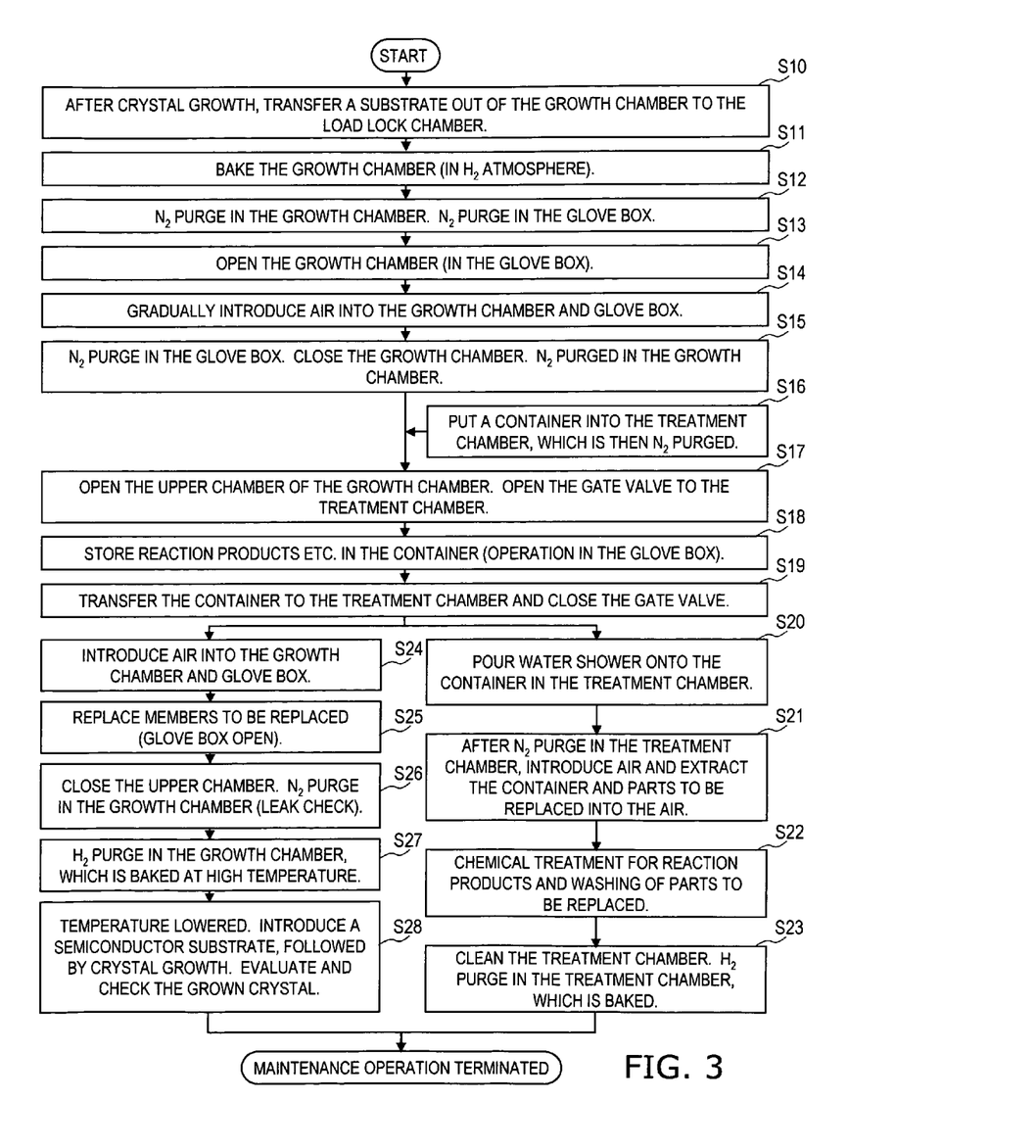
FIG. 3 is a flow chart of a semiconductor manufacturing method according to the first embodiment.

FIG. 3 is a flow chart showing an embodiment of the semiconductor manufacturing method of the embodiment.

Figure 4:
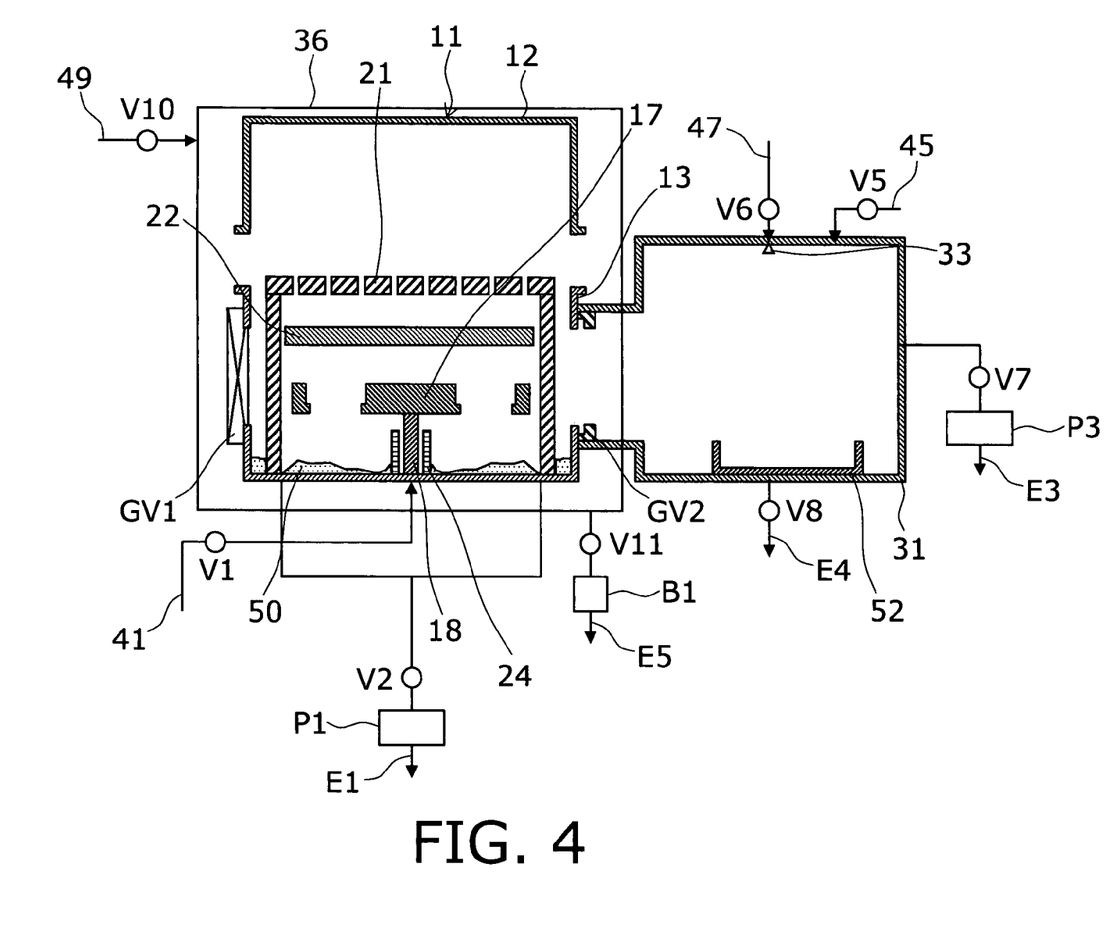
FIG. 4 is a cross section of the growth chamber and the treatment chamber showing a step in the semiconductor manufacturing method according to the first embodiment.
Figure 5:
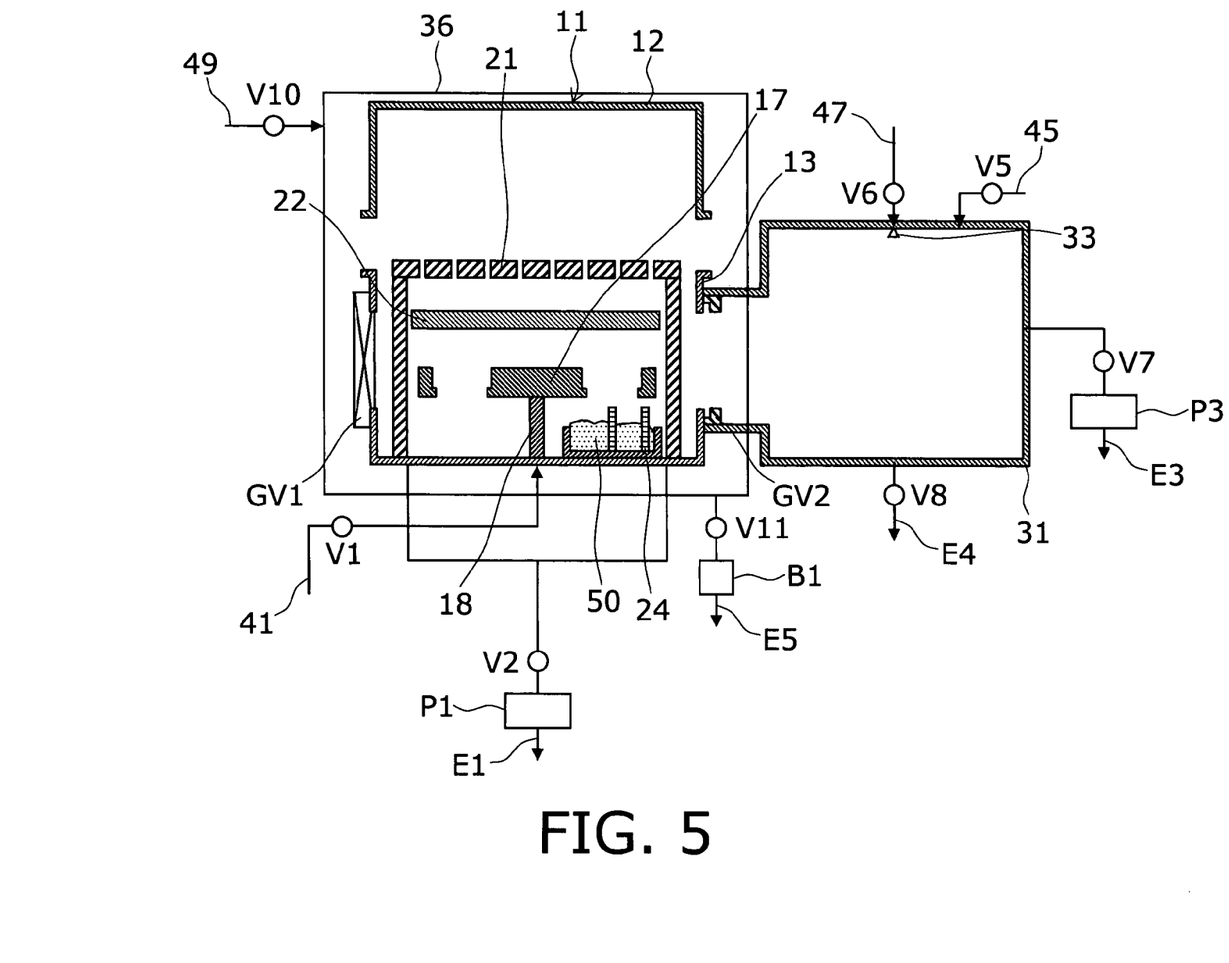
FIG. 5 is a cross section of the growth chamber and the treatment chamber showing a step subsequent to the step shown in FIG. 4.
Figure 6:
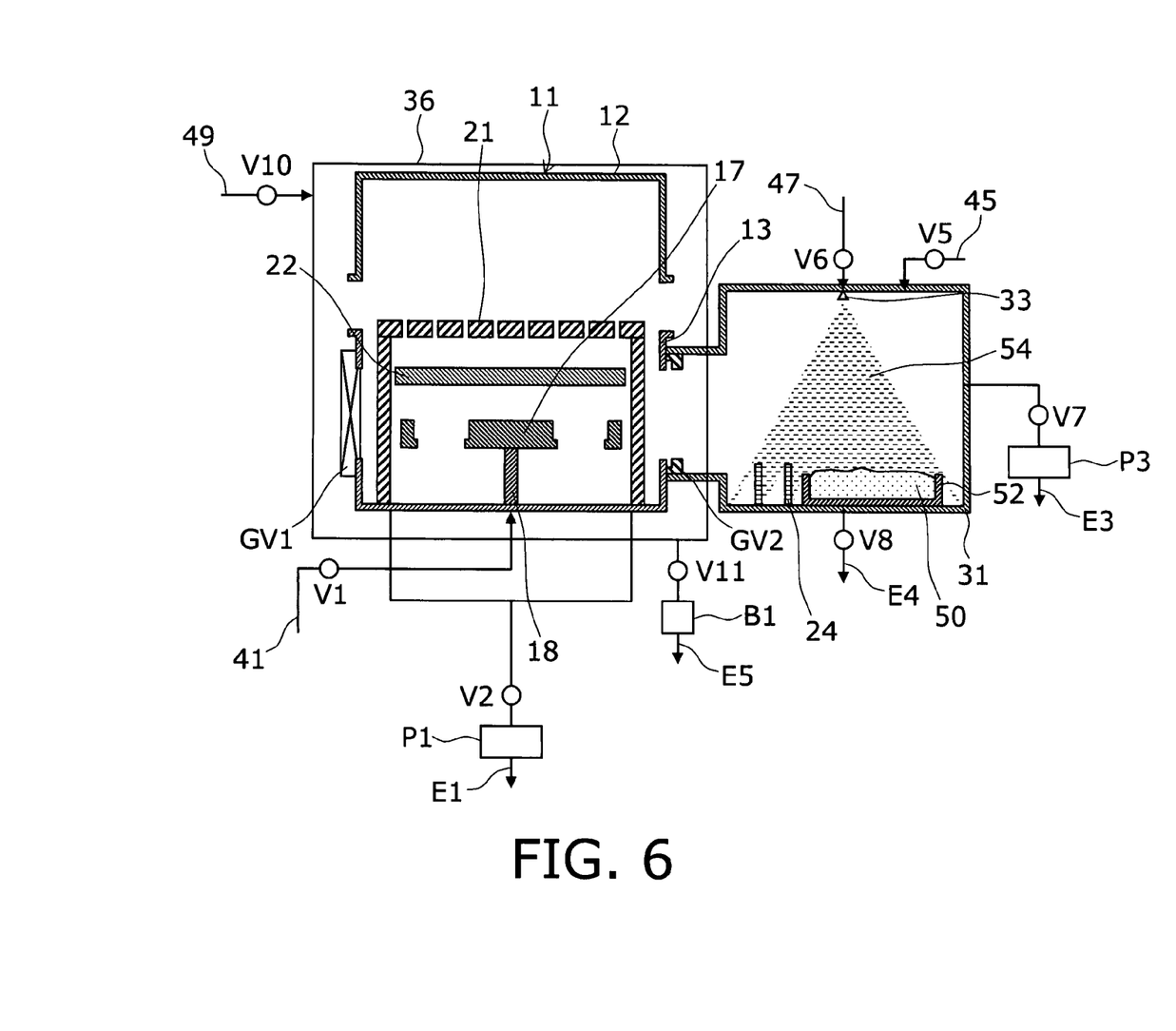
FIG. 6 is a cross section of the growth chamber and the treatment chamber showing a step subsequent to the step shown in FIG. 5.

FIGS. 4-6 are cross sections of the growth chamber and the treatment chamber showing steps of the semiconductor manufacturing method.

As shown in FIG. 1, in the growth chamber 11, a material gas supply line 41 for supplying material gases and the like required for crystal growth of desired semiconductor layers is connected to the bottom center of the lower chamber 13. By way of illustration, crystal growth of an InGaAlP-based epitaxial layer capable of emitting visible light is described. In this case, the material gases include group III metal organic compounds containing In, Ga, and Al and group V compounds containing phosphorus (P) such as $PH_3$ (phosphine), which serve as principal ingredients. In addition, dopant material gases are used for providing epitaxial layers with p-type or n-type conductivity. Moreover, hydrogen ($H_2$) is used as a carrier gas or a reducing gas, nitrogen ($N_2$) is used as an inert gas, and air (or mixed gas of $N_2$ and oxygen ($O_2$)) is used for oxidation and when the chamber is opened to the atmosphere. These gases are collectively depicted as the material gas supply line 41. The material gas supply line 41 is controllably opened and closed by an air actuated valve V1 for each gas.

To the bottom periphery of the lower chamber 13 of the growth chamber 11 is connected an exhaust line E1 having an air actuated valve V2 and an exhaust pump P1. The exhaust gas led into the exhaust line E1 passes through the air actuated valve V2, the exhaust pump P1, and an abatement system (not shown) and is ejected into the atmosphere.

Starting from the side near the inlet of the material gas supply line 41, the growth chamber 11 contains a supporting plate 17 for supporting the substrate 15, a heat spreading plate 22 placed above the supporting plate 17 for uniform heating, and a resistance heater 21 placed above the heat spreading plate 22. The supporting plate 17 is rotatably supported at its center by a supporting shaft 18 extending from the bottom of the lower chamber 13 and has a mechanism (not shown) for independently rotating the substrate 15. Material gases and the like are introduced from a gas feed pipe 24 placed around the supporting shaft 18. The introduced material gases and the like are caused to flow radially from the center toward the periphery of the lower chamber 13. During the crystal growth process, reaction product 50 is adhered to the bottom and other portions of the lower chamber 13.

The load lock chamber 26 serves to prevent the growth chamber 11 from being open to the atmosphere when the substrate 15 before and after crystal growth in the growth chamber 11 is loaded or unloaded. The load lock chamber 26 is illustratively made of stainless steel. A nitrogen/air supply line 43 having an air actuated valve V3, and an exhaust line E2 having an air actuated valve V4 and an exhaust pump P2 are connected to the load lock chamber 26. The load lock chamber 26 also has a transfer mechanism (not shown) for the substrate 15 by which the substrate 15 is loaded and unloaded.

The treatment chamber 31 serves to perform ignition preventing treatment for preventing ignition or other reactions from occurring when the reaction product 50 is exposed to the atmosphere, and has a sufficient capacity for storing the reaction product 50 and the members with adhered reaction product 50. The treatment chamber 31 is made of stainless steel, for example. The treatment chamber 31 is connected to the growth chamber 11 via the gate valve GV2 and has a hatch (not shown) capable of opening the chamber to the atmosphere. A nitrogen/air supply line 45 having an air actuated valve V5, and an exhaust line E3 having an air actuated valve V7 and an exhaust pump P3 are connected to the treatment chamber 31.

A water supply line 47 having an air actuated valve V6 for supplying pure water or the like is connected to the top of the treatment chamber 31, and a wastewater line E4 having an air actuated valve V8 is connected to the bottom of the treatment chamber 31. The inlet of the water supply line 47 inside the treatment chamber 31 has a detachable spray nozzle 33 for supplying atomized pure water. The treatment chamber 31 has grooves (not shown) on its bottom for guiding pure water and the like to the wastewater line E4. The treatment chamber 31 may also have a heater around its stainless steel periphery for the purpose of removing water in the treatment chamber 31 after the ignition preventing treatment.

The growth chamber 11 is surrounded by a glove box 36 having gloves 37 made of hermetic rubber or plastic. The glove box 36 is illustratively assembled from steel and transparent resin plates. A nitrogen/air supply line 49 having an air actuated valve V10, and an exhaust line E5 having an air actuated valve V11 and a blower B1 are connected to the glove box 36. Operations inside the glove box 36 and inside the opened growth chamber 11 can be conducted by hands inserted into the gloves 37 provided on the glove box 36. The glove box 36 also has an opening door (not shown) capable of opening it to the atmosphere.

In the MOCVD apparatus 1 of the above configuration, a substrate 15 is set on the supporting plate 17 with the crystal growth surface of the substrate 15 facing downward, and then subjected to crystal growth in a heated condition. Part of the material gas thermally decomposed during crystal growth or during standby is used for crystal growth or maintaining the vapor pressure. Part of the material that was not used for crystal growth or that was used for maintaining the vapor pressure is deposited as reaction product 50 on the bottom and other portions of the lower chamber 13. Much of the material thermally decomposed at high temperatures near the supporting plate 15 is cooled near the bottom of the lower chamber 13 to form reaction product 50 containing P and P compounds, and adhered to the bottom and side of the lower chamber 13 and to its members such as the gas feed pipe 24.

With the repetition of the crystal growth process, the amount of deposited reaction product 50 increases. This leads to increased impurity concentration in the growth chamber 11 due to the reaction product 50 and to the dispersion of fine particles of the reaction product 50. The exhaust port of the growth chamber 11 led to the exhaust line E1 is narrowed, which prevents the desired epitaxial crystal growth. Before a trouble with crystal growth, a maintenance operation is needed for removing reaction product 50 to maintain or recover the condition suitable for crystal growth in the growth chamber 11.

Next, the maintenance operation in the growth chamber 11 is described. In semiconductor manufacturing methods of performing crystal growth for semiconductor lasers or light emitting diodes, reaction product 50 is removed after a plurality of repetition of crystal growth.

As shown in FIG. 3, the crystal growth process for a semiconductor light emitting device or the like immediately before the maintenance operation is terminated. The temperature is decreased to a level suitable for substrate transfer, the gate valve GV1 is opened, and the substrate 15 is transferred from the growth chamber 11 to the load lock chamber 26 (step S10).

While the gate valves GV1 and GV2 connected to the growth chamber 11 are closed, the growth chamber 11 is filled with $H_2$ atmosphere. The heater 21 is used to heat the growth chamber 11 to a temperature higher than the crystal growth temperature, thereby baking it for several hours, e.g., 2 hours (step S11). This is intended to exhaust P or other group V elements in the growth chamber 11 as much as possible.

The heater 21 is turned off to lower the temperature of the growth chamber 11, which is purged with inert $N_2$ atmosphere. In addition, the glove box 36 is purged with inert $N_2$ atmosphere (step S12).

The upper chamber 12 of the growth chamber 11 is raised, and the growth chamber 11 is opened to the $N_2$ atmosphere in the glove box 36 (step S13).

A gas sensor (not shown) sensitive to $PH_3$ and the like is used to check the absence of such gas. Then, air is introduced into the glove box 36 in small amounts from the material gas supply line 41 of the growth chamber 11 or the nitrogen/air supply line 49 of the glove box 36 (step S14). This is intended to gradually oxidize the surface of reaction product 50 deposited on the bottom and other portions of the lower chamber 13. Alternatively, instead of air, it is possible to feed $O_2$ and $N_2$ simultaneously.

Then, $N_2$ is introduced into the glove box 36, and the glove box 36, including the growth chamber 11, is purged with $N_2$ atmosphere. Then the upper chamber 12 of the growth chamber 11 is closed. The growth chamber 11 is evacuated and then purged with $N_2$ atmosphere (step S15).

A container 52 for storing reaction product 50 and the like is put into the treatment chamber 31 through the hatch (not shown) open to the atmosphere. The hatch is closed, and the treatment chamber 31 is purged with $N_2$ atmosphere (step S16). Step S16 may be conducted in parallel with step S15.

The upper chamber 12 of the growth chamber 11 is raised, and the gate valve GV2 is opened. The growth chamber 11 and the treatment chamber 31 are now in communication with each other in the glove box 36 under $N_2$ atmosphere (step S17).

As shown in FIG. 4, reaction product 50 is deposited on the bottom and other portions of the lower chamber 13, and the container 52 is placed in the treatment chamber 31. If the glove box 36 has room for the container 52 in an area accessible by the gloves 37, the container 52 may be placed in the glove box 36. To use tools for the collecting operation, the tools should be prepared together with the container 52 in the glove box 36. A suction machine can also be prepared for use as with the collecting tools.

The container 52 in the treatment chamber 31 is moved into or near the growth chamber 11. Reaction product 50 deposited on the bottom and other portions of the lower chamber 13 of the growth chamber 11, and members with adhered reaction product 50, are stored in the container 52 (step S18). This storing operation is conducted by hands inserted into the gloves 37 of the glove box 36. Collecting tools or a suction machine may also be used.

As shown in FIG. 5, the reaction product 50 is collected and stored in the container 52. The members to be replaced, such as the gas feed pipe 24 with adhered reaction product 50, are also stored in the container 52.

The container 52 containing the reaction product 50 and the like is transferred to the treatment chamber 31 under $N_2$ atmosphere by hands in the gloves 37. Then the gate valve GV2 is closed, and the treatment chamber 31 is separated from the growth chamber 11 (step S19). The reaction product 50 transferred to the treatment chamber 31 may be transferred to another container (not shown) having a larger opening. The members such as the gas feed pipe 24 with adhered reaction product 50 may be transferred to another container (not shown).

Because the growth chamber 11 is separated from the treatment chamber 31 by the gate valve GV2, operations can be conducted in parallel in each chamber.

In the treatment chamber 31 under $N_2$ atmosphere, the wastewater line E4 and the water supply line 47 are opened. Water shower 54 is poured from the overlying spray nozzle 33 onto the reaction product 50 and the members such as the gas feed pipe 24 in the treatment chamber 31 (step S20).

As shown in FIG. 6, immediately before water shower 54 is poured, the exhaust line E3 is closed, and the wastewater line E4 is opened. Water shower 54 is poured so that the reaction product 50 is sufficiently moistened. Excess water flows along the bottom and the grooves (not shown) formed on the bottom of the treatment chamber 31, and is ejected from the wastewater line E4. The ejected water is recovered.

In the treatment chamber 31, the water shower 54 is stopped, the wastewater line E4 is closed, and the exhaust line E3 is opened. After the treatment chamber 31 is purged with $N_2$ atmosphere, air is gradually introduced, and the hatch (not shown) is opened to the atmosphere. The reaction product 50 and the members such as the gas feed pipe 24 that have absorbed sufficient moisture are extracted into the atmosphere (step S21).

The extracted reaction product 50, as well as the reaction product 50 recovered from the ejected water, are subjected to chemical treatment such as dissolution in aqua regia. The members such as the gas feed pipe 24 are subjected to chemical treatment or washing as needed (step S22).

After the treatment chamber 31 is cleaned, the hatch is closed. After $N_2$ purge, the treatment chamber 31 is $H_2$ purged and then baked in the $H_2$ atmosphere (step S23).

On the other hand, the growth chamber 11, with the gate valve GV2 being closed in step S19, is open in the glove box 36. In this condition, under $N_2$ atmosphere, air is introduced into the growth chamber 11 in small amounts (step S24). This is intended to gradually oxidize a trace amount of reaction product 50 left behind after most of the reaction product 50 deposited on the bottom and other portions of the lower chamber 13 are removed, thereby preparing for the subsequent exposure to the atmosphere. Separating the growth chamber 11 from the treatment chamber 31 with the gate valve GV2 makes it also possible to perform operations in step S20 to step S23 on the treatment chamber and operations in step S24 to S28 on the growth chamber, simultaneously.

A gas sensor is used to check that such gases as $PH_3$ are not sensed. The opening door (not shown) of the glove box 36 is opened, and a gas feed pipe 24 and other replacement members without adhered reaction product 50 are installed at prescribed locations in the growth chamber 11 (step S25).

The upper chamber 12 of the growth chamber 11 is closed. The growth chamber 11 is $N_2$ purged and leak checked (step S26).

The growth chamber 11 is purged with $H_2$ atmosphere. The heater 21 is used to heat the growth chamber 11 to a temperature higher than the crystal growth temperature, thereby baking it until reaching a certain degree of vacuum (step S27).

The temperature of the growth chamber 11 is lowered to a level at which the substrate 15 can be transferred. The gate valve GV1 is opened. The substrate 15 is set on the supporting plate 17 and placed in an adjusted atmosphere gas. It is again heated to start crystal growth again. The condition in the growth chamber 11 is illustratively evaluated by PL (photoluminescence) of the grown crystal (not shown) (step S28). The maintenance operation is terminated by checking that the grown crystal meets the evaluation criteria. Then, crystal growth for manufacturing a semiconductor light emitting device is started.

As described above, this embodiment includes a growth chamber 11 where material gases containing P are thermally decomposed for performing crystal growth on a substrate 15 and maintaining the vapor pressure. The growth chamber 11 is connected via a gate valve GV2 to a treatment chamber 31, which is capable of storing reaction product 50 and a gas feed pipe 24 with adhered reaction product 50 and pouring water on them. The growth chamber 11 is hermetically surrounded by a glove box 36 having gloves 37 which can be used for the operation of collecting and storing the reaction product 50 and the like produced in the growth chamber 11. Pouring water on the reaction product 50 can prevent P from reacting with oxygen in the air and catching fire. That is, the MOCVD apparatus 1 allows the operation of safely removing reaction product 50 containing P.

The growth chamber 11 is separated from the treatment chamber 31 via the gate valve GV2. Hence, after the reaction product 50 is removed to the treatment chamber 31, the gate valve GV2 can be closed to independently perform the operation of restoring the growth chamber 11 to the condition available for crystal growth. Consequently, as compared to the case of performing the operation of moistening the reaction product 50 in the growth chamber 11, it takes a shorter work time to restore the growth chamber 11 to the condition available for crystal growth. Therefore the decrease of operating rate of the MOCVD apparatus 1 can be prevented.

In the treatment chamber 31 sealed by the gate valve GV2, the diffusion, if any, of reaction product 50 during pouring water is limited within the treatment chamber 31, and does not affect the members related to crystal growth. The duration of pouring water can be extended as necessary. Thus the ignition preventing treatment is sufficiently performed on the reaction product 50 so that they do not catch fire even if they are extracted into the atmosphere.

The invention is not limited to the embodiment described above and can be practiced through various modifications without departing from the spirit of the invention.

For instance, while the growth chamber is surrounded by the glove box in the embodiment, the treatment chamber may also be surrounded by the glove box. The treatment chamber may have a hatch on the glove side. The operation of moistening the reaction product can be assisted through the hatch by hands in the gloves to reduce the period of time and the amount of water. Furthermore, the water for moistening the reaction product can be put in a spray, for instance, which is then brought in through the hatch. When the spray is brought in, the water supply line may not be necessarily installed in the treatment chamber.

While the water supply line is connected to the pure water line in the embodiment, it may not be necessarily a pure water line. The spray nozzle may have a variable spray direction besides being detachable.

In the embodiment, the container storing the reaction product and the like is transferred to the treatment chamber by hands in the gloves. However, a jig may be used for stable transport or for transport to a location unreachable by the gloves. In addition, the treatment chamber may be provided with a carrying mechanism that extends to the vicinity of the opening of the gate valve, such as a carriage having a pantograph mechanism, for transferring reaction product and the like between the growth chamber and the treatment chamber. This allows safe and stable transfer for a large growth chamber.

Semiconductor manufacturing apparatuses such as a chloride VPE apparatus, hydride VPE apparatus, or other CVD and VPE apparatuses based on P-containing material gases may be used.

The MOCVD apparatus of the embodiment uses face-down mounting of the substrate, radial flow of material gases and the like, and a resistance heater. However, in the MOCVD apparatus, the substrate may be mounted face-up, the material gases and the like may be caused to flow in one direction such as a vertical or horizontal direction, and a radio-frequency heater may be used.

The growth chamber 11 and the treatment chamber 31 are not necessarily connected by the gate valve GV2.

Figure 7:
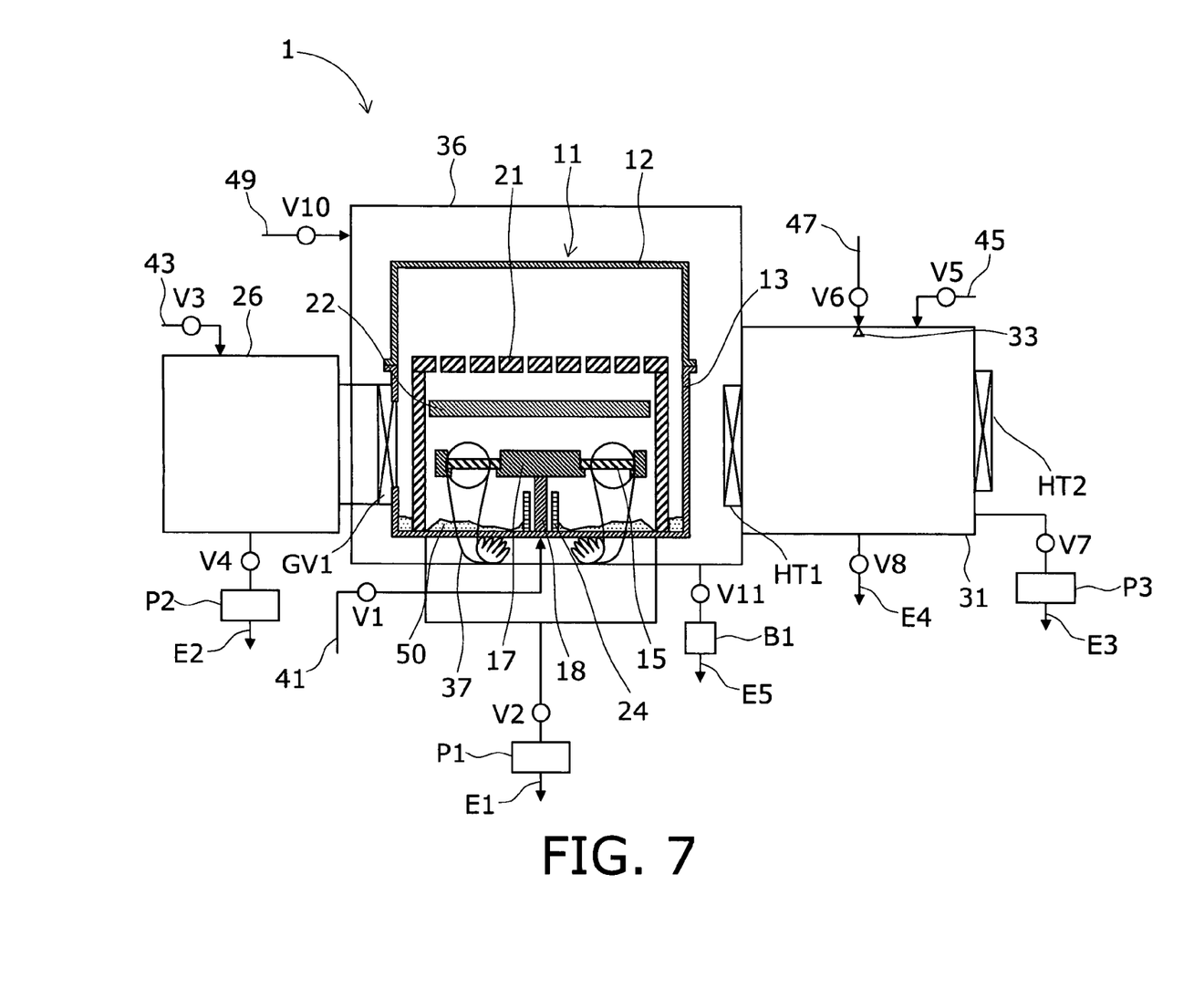
FIG. 7 is a schematic front view of a semiconductor manufacturing apparatus according to a second embodiment.

FIG. 7 is a schematic front view of a semiconductor manufacturing apparatus according to second embodiment.

In this embodiment, the treatment chamber 31 is separate from the growth chamber 11. A first hatch HT1 and a second hatch HT2 are provided to the treatment chamber 31. The inside of the treatment chamber 31 can be hermetically sealed after these hatches HT1 and HT2 are closed. The first hatch HT1 is placed in the glove box 36.

After purging the growth chamber 11, the treatment chamber 31 and the glove box 36 with an inert gas, the first hatch HT1 is opened in the aforementioned step S102 shown in FIG. 2 or step S17 shown in FIG. 3. Then, the reaction product accumulated in the growth chamber 11 is taken out and safely transferred to the treatment chamber 31 in the inert atmosphere in the glove box 36.

After that, the hatch HT1 is closed and the reaction product is moistened in the treatment chamber in the aforementioned step S106 shown in FIG. 2 or step S20 shown in FIG. 3. The sufficiently moistened reaction product is taken out from the second hatch HT2 to the outside of the system (step S108 or step S21).

According to another aspect of the invention, there is provided a semiconductor manufacturing apparatus comprising: a growth chamber in which a material gas is decomposed for crystal growth; a treatment chamber in which reaction product that have been formed in the growth chamber is moistened; a connecting portion openably and closably interconnecting between the growth chamber and the treatment chamber; and a glove box hermetically surrounding the growth chamber.

According to another aspect of the invention, there is provided a semiconductor manufacturing apparatus comprising: a growth chamber in which a material gas is decomposed for crystal growth; a treatment chamber in which reaction product that have been formed in the growth chamber is moistened, the treatment chamber having a first hatch; and a glove box hermetically surrounding the growth chamber and the first hatch.

The invention claimed is:

1. A semiconductor manufacturing method comprising:
   purging a growth chamber including a reaction product, a treatment chamber, and a glove box hermetically surrounding the growth chamber, with an inert gas atmosphere;
   opening the growth chamber in the glove box and introducing a gas including oxygen into the glove box;
   transferring the reaction product from the growth chamber to the treatment chamber after the introducing the gas including oxygen into the glove box, followed by moistening the reaction product in the treatment chamber; and extracting the moistened reaction product into the atmosphere.

2. A semiconductor manufacturing method of claim 1, wherein the growth chamber and the treatment chamber are portion openably and closably interconnected by a connection portion, and the reaction product are transferred through the opened connection portion.

3. A semiconductor manufacturing method of claim 1, wherein the treatment chamber is provided separately from the growth chamber and has a hatch which can be opened and closed, and the reaction product is transferred through the hatch which is opened.

4. A semiconductor manufacturing method of claim 1, wherein, when the reaction product is transferred from the growth chamber to the treatment chamber, a member with the reaction product adhered thereto in the growth chamber is simultaneously transferred to the treatment chamber.

5. A semiconductor manufacturing method of claim 1, wherein the moistening the reaction product is performed by pouring water from a water supply line provided in the treatment chamber.

6. A semiconductor manufacturing method of claim 1, wherein the reaction product contains phosphorus.

7. A semiconductor manufacturing method of claim 1, further comprising purging the glove box with an inert gas after the introducing the gas including oxygen into the glove box and before the transferring the reaction product.

8. A semiconductor manufacturing method of claim 1, further comprising introducing an air into the growth chamber, opening the growth chamber and replacing a member placed inside the growth chamber after the transferring the reaction product.

* * * * *